United States Patent [19]
Morey

[11] Patent Number: 5,946,609
[45] Date of Patent: Aug. 31, 1999

[54] REDUCED-RADIATION RADIO SIGNAL RECEIVERS

[75] Inventor: Gilles Morey, Saint Ismier, France

[73] Assignee: Atral, France

[21] Appl. No.: 08/810,382

[22] Filed: Mar. 3, 1997

[30] Foreign Application Priority Data

Mar. 4, 1996 [FR] France ................................... 96 02675

[51] Int. Cl.[6] ...................................................... H04B 1/16
[52] U.S. Cl. ........................... 455/336; 455/334; 455/338; 455/310
[58] Field of Search ..................................... 455/212, 214, 455/215, 293, 296, 299, 310, 334, 336, 337, 338, 193.1, 196.1, 271, 317

[56] References Cited

U.S. PATENT DOCUMENTS

| | | | |
|---|---|---|---|
| 4,393,514 | 7/1983 | Minakuchi et al. | 455/215 |
| 5,105,162 | 4/1992 | Fleissner et al. . | |
| 5,327,582 | 7/1994 | Wong | 455/196.1 |
| 5,621,756 | 4/1997 | Bush et al. | 455/336 |
| 5,678,212 | 10/1997 | Sakai et al. | 455/193.1 |
| 5,740,523 | 4/1998 | Nakajima et al. | 455/296 |

FOREIGN PATENT DOCUMENTS 2 066 006  7/1981  United Kingdom .

Primary Examiner—Dwayne D. Bost
Assistant Examiner—Quochien Ba Vuong
Attorney, Agent, or Firm—Conley, Rose & Tayon, PC; Eric B. Meyertons, Esq.

[57] ABSTRACT

A radio receiver with isolation between an antenna and a regenerative oscillator/detector. The isolation is provided by periodically (at the receiver's quench frequency) uncoupling the antenna from the regenerative oscillator/detector. The receiver preferably includes an antenna, a super-regenerative oscillator/detector, a clock that indicates the quench frequency, a timing circuit coupled to the clock, and a switch coupled to the antenna, to the oscillator/detector, and to the timing circuit. The timing circuit specifies a first part and a second part of each clock period. During the first part of each clock period, the switch at least partially couples the antenna to the oscillator/detector on the nominal reception frequency. During the second part of each clock period, the switch at least partially uncouples these two elements on the nominal reception frequency. The timing circuit determines the first and second parts of each clock period so that the first part corresponds to a phase of sensitivity for the oscillator/detector, and so that the second part corresponds to phases in which oscillations in the oscillator/detector rise in amplitude, and/or have an increased amplitude, and/or decay in amplitude. Thus, the inadvertent emission of electromagnetic radiation from the regenerative oscillator/detector at the nominal reception frequency is attenuated or suppressed at least during the second part of each clock period.

50 Claims, 7 Drawing Sheets

REDUCED-RADIATION RADIO SIGNAL RECEIVERS

FIELD OF THE INVENTION

The present invention relates to receivers of radio signals, and in particular to receivers with super-regenerative detectors.

DESCRIPTION OF THE RELATED ART

Through their simplicity, their low cost and their low consumption of electrical energy, such receivers, employing super-regenerative oscillators (or super-regenerative detectors), have been used for a number of years to effect short-distance radio links in particular between the various elements constituting alarm, security or home-automation systems, or various remote controls in particular in the motor vehicles sector.

Owing to their principle of operation, which consists in successively blocking and unblocking their oscillator/detector, such receivers generate electromagnetic energy which can be radiated by their antennas.

This radiated electromagnetic energy thus makes it difficult for two or more closely positioned receivers with super-regenerative oscillator/detector to share the same nominal frequency or close nominal frequencies. These receivers may possibly blind one another. Receivers of different kinds may suffer from similar interference effects if one of them is a super-regenerative receiver.

A solution afforded hitherto in order to reduce the parasitic electromagnetic radiation of receivers comprising a super-regenerative oscillator/detector consists in introducing one or more amplifier stages mounted as buffers between the antenna and the super-regenerative oscillator/detector.

Although relatively effective and moreover making it possible to obtain increased sensitivity of reception, this solution nevertheless exhibits the drawbacks of rendering this super-regenerative receiver more complex and hence more costly, of increasing its consumption of electrical energy, of possibly requiring several additional adjustments and of introducing distortions through intermodulation which impair this receiver with regard to high-power radio signals regardless of frequency and/or which result from intentional or unintentional jamming.

SUMMARY OF THE INVENTION

Described herein is a super-regenerative receiver which makes it possible to attenuate or suppress the parasitic radiations of such a receiver.

The radio receiver preferably comprises means for fixing in each period of said oscillator/detector a first part (A1), corresponding substantially to the phase of sensitivity (A) of this oscillator/detector, followed by a second part (T) corresponding substantially to the phase of amplitude rise or increased amplitude (B, C) and of decay (D) of the oscillations of said oscillator/detector, and coupling/uncoupling means linked to the antenna and/or to said oscillator/detector, which at least partially couple the antenna to the oscillator/detector on the nominal reception frequency (f1) during said first part (A1) of each of said periods and which at least partially uncouple the antenna from the oscillator/detector on the nominal reception frequency (f1) during at least said second part (T) of each of said periods, so that the electromagnetic energy apt to be emitted by the receiver on said nominal frequency at least during said second part (T) of each of said periods is attenuated or suppressed.

The receiver of radio signals can exhibit the following various preferred alternative embodiments.

Said coupling/uncoupling means may advantageously comprise switching and/or attenuating and/or amplifying and/or filtering means connected between said antenna and said oscillator/detector and means of control of these switching and/or attenuating and/or amplifying and/or filtering means so as, during each of said periods, to connect said antenna to said oscillator/detector (2) during said first part (A1) of said periods (21a) and so as at least partially to disconnect said antenna from said oscillator/detector at least during their second part (T).

Said switching means may advantageously comprise an electronic switch mounted between said antenna and said oscillator/detector, means for closing this switch solely during said first part (A1) of said periods and means for disconnecting said antenna or for connecting this antenna to ground at least during said second part (T) of said periods.

Said coupling/uncoupling means may advantageously comprise attenuating means mounted between said antenna and said oscillator/detector and means of control of these attenuating means so as, during each of said periods, to connect said antenna to said oscillator during said first part of said periods and to reduce the amplitude of the signals which may be radiated by the antenna at least during the second part (T) of said periods.

Said coupling/uncoupling means may advantageously comprise a filter mounted between said antenna and said oscillator/receiver, this filter being tuned to exhibit the minimum of loss or attenuation on said nominal frequency during said first part (A1) of said periods and comprising means so as to be tuned to another frequency during said second part (T) of said periods and to exhibit the maximum of loss or attenuation on said nominal frequency during this second part (T).

Said coupling/uncoupling means may advantageously comprise a tunable filter circuit comprising in parallel a self-inductance, two variable-capacitance diodes in opposition and in series, and a capacitance, the self-inductance being linked to the antenna, the point of linkage between said diodes being linked to the means fixing said first and second parts, one of the ends of this circuit being linked to ground and the other linked to the input of the oscillator/detector.

Said coupling/uncoupling means may advantageously comprise amplifying means connected between the antenna and the oscillator/detector and means of control so as, during solely the first part of said sequences, to cause these amplifying means to operate in such a way as to amplify the signal picked up by the antenna and to deliver this amplified signal to the oscillator/detector and so as, during the second part (T) of said periods, to disconnect these amplifying means.

Said coupling/uncoupling means may advantageously comprise means for causing said oscillator/receiver to oscillate at an auxiliary frequency (f2) different from said nominal reception frequency (f1) during said second part (T) of said periods.

Said coupling/uncoupling means may advantageously comprise a fixed filter, such as a quartz filter, with passband width less than that of said oscillator/detector, tuned to the nominal reception frequency (f1) of this oscillator/detector.

Said coupling/uncoupling means may advantageously comprise a frequency-selective antenna constituting the aforesaid filter.

Said coupling/uncoupling means preferably constitute, in respect of the signal at the nominal reception frequency and by virtue of a feedback circuit, a circuit attenuating the level of the signal received at the nominal frequency f1 reaching the oscillator/detector, which can be controlled or is variable in amplitude, in frequency or temporally as a function of the amplitude of the low-frequency output signal, partially passing during said first part (A1) of said periods, thus constituting an automatic gain control.

Said abovementioned means for fixing in each sequence of oscillations of said oscillator/detector said first part followed by said second part may advantageously comprise a monostable whose two states respectively determine these first and second parts, the duration of these two states corresponding to the duration of said blocking/unblocking sequences of said oscillator/detector.

BRIEF DESCRIPTION OF THE DRAWINGS

The receiver of radio signals will be better understood on studying reduced-radiation radio signal receivers described by way of non-limiting examples and illustrated by the drawing in which.

DESCRIPTION OF THE PREFERRED EMBODIMENT

Figure 1:
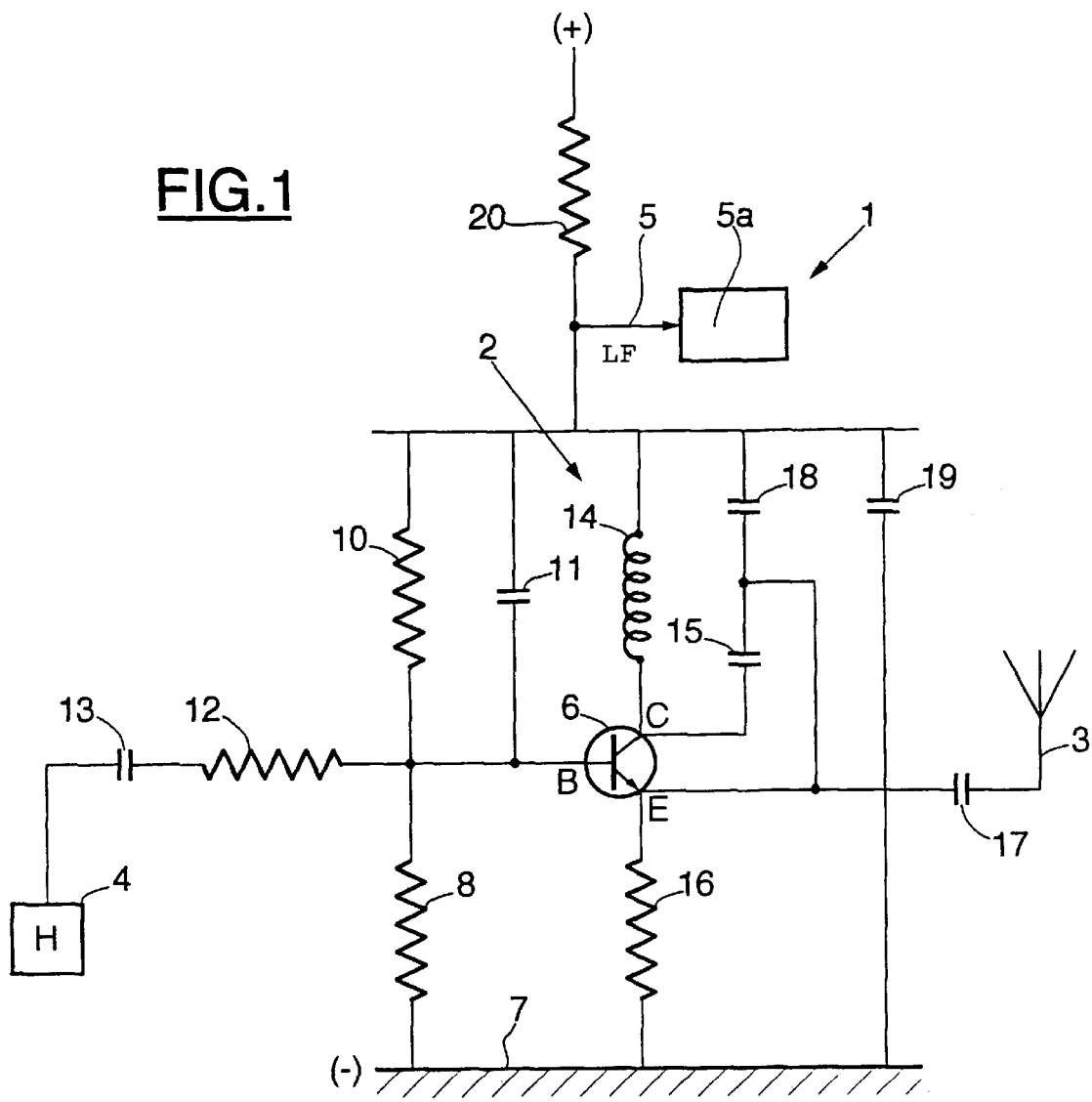
FIG. 1 represents a layout of a receiver comprising a super-regenerative oscillator/detector.

Referring to FIG. 1, it may be seen that the radio signal receiver represented, labeled in a general way by the reference 1, comprises a super-regenerative oscillator/detector, labeled in a general manner by the reference 2, linked to an antenna 3 for receiving electromagnetic waves, which receives successive signals for blocking/unblocking a clock 4 enabling it to oscillate on its nominal reception frequency f1 periodically during oscillation sequences of a determined duration and delivering on an output point 5 a low-frequency LF signal directed to a processing facility 5a.

In the example represented, the oscillator/detector 2 comprises an active element consisting of a transistor 6 whose base is linked to the (−) pole of a supply or ground 7 by way of a resistance 8, to the point 5 via a resistance 10 and a capacitance 11 in parallel, and to the clock 4 via a resistance 12 and a capacitance 13 in series.

The collector of the transistor 6 is linked to the point 5 by way of a self-inductance 14 constituting a reactive element, and to its emitter by way of a feedback capacitance 15.

The emitter of the transistor 6 is linked to the (−) pole via a resistance 16, to the antenna 3 via a capacitance 17 and to the point 5 by an impedance matching capacitance 18.

A filtering capacitance 19 links the point 5 to ground 7.

The point 5 is linked to the (+) pole of the power supply through a resistance 20, detection of the low-frequency (LF) modulation being done by extracting the variation in the mean current consumed by the oscillator/detector stage 2.

Figure 2:
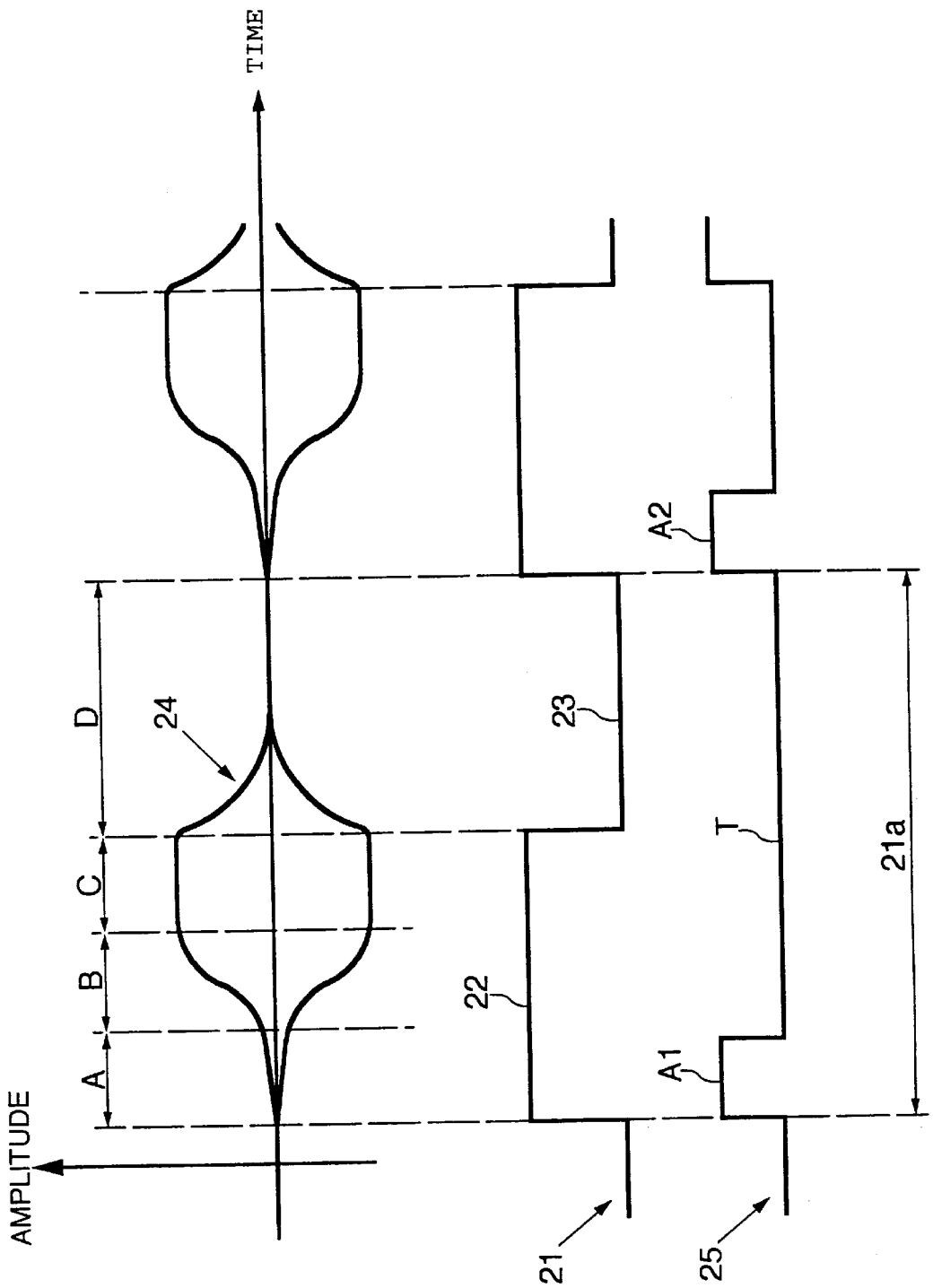
FIG. 2 represents an operating diagram for this super-regenerative receiver.

Referring to FIG. 2 it may be seen that this represents a general operating diagram of the receiver 1 of FIG. 1.

Represented in this FIG. 2 may be seen the shape of a strobe control signal 21 determining periods 21a of blocking/unblocking of the oscillator/detector 2. This signal is delivered by the clock 4 which fixes in each period 21a, cyclically, unblocking sequences 22 followed by blocking sequences 23 for this oscillator/detector 2.

Also represented in FIG. 2, in correspondence with the clock signal 21, is a particular envelope curve, labeled in a general manner by the reference 24, of the amplitude of the oscillations of the oscillator/detector 2 in the so-called logarithmic mode of detection.

It may be seen that this curve 24 comprises in each unblocking sequence 22 for the oscillator/detector 2 a phase A of sensitivity, followed by a phase B of growth of the amplitude of the oscillations of the oscillator/detector 2, followed by a phase C of stabilization of this amplitude and followed, in the blocking sequence 23, by a phase D of decline or progressive and rapid decay of this amplitude. The phase C need not exist and, in a so-called linear mode of detection, not represented, phase D would come before the end of phase B.

Likewise represented in FIG. 2 may be seen a control signal 25 whose duration corresponds to the aforesaid period 21a and which comprises a first part A1 which corresponds substantially to the aforesaid phase of sensitivity A of the oscillator/detector 2, followed by a second part T. Thus, this second part T spans the aforesaid phases B, C and D of increased amplitude of the oscillations of the oscillator/detector 2. In the example represented, the first part A1 is shorter than the phase of sensitivity A.

Figure 3:
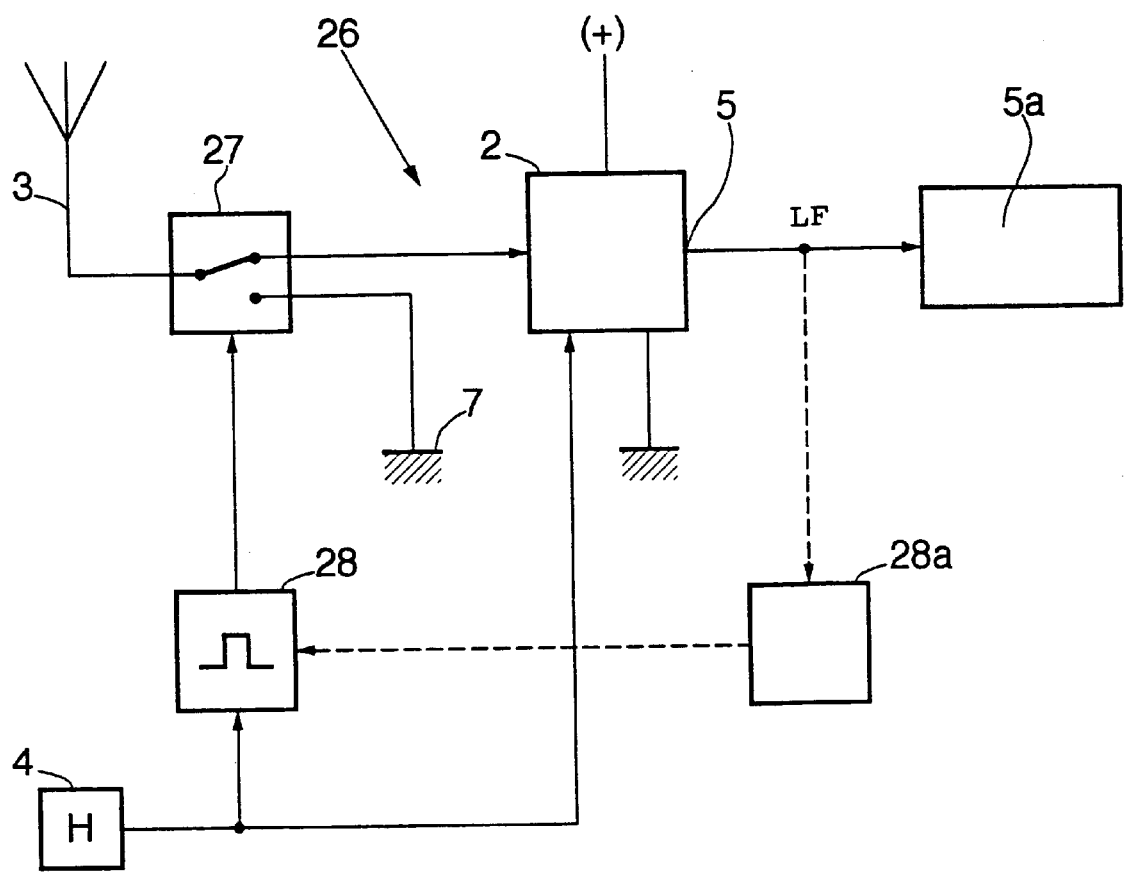
FIG. 3 represents a first embodiment of a receiver.

Referring now to FIG. 3, it may be seen that this represents a receiver 26 which corresponds to the receiver 1 described with reference to FIG. 1 but which furthermore comprises, between the oscillator/detector 2 and the antenna 3, an electronic coupling/uncoupling circuit-breaker or switch bearing the reference 27. This switch 27 is controlled by a monostable circuit 28 which is sequenced by the clock 4 and whose two states respectively determine the aforesaid phases A1 and T.

This receiver 26 operates in the following way.

On the rising edge of the clock signal 21 corresponding to the start of the unblocking sequence 22 for the oscillator/detector 2, the monostable 28 is latched for a determined duration corresponding to the aforesaid first part A1 and operates the switch 27 for this duration in such a way as to couple or link the antenna 3 to the oscillator/detector 2. Then, on completion of the duration of this first part A1, the monostable 28 triggers and operates the switch 27 in such a way as, during the aforesaid phase T terminating at the end of the aforesaid period 21a, to decouple the oscillator/detector 2 and to link this antenna 3 to ground 7.

Thus, because the antenna 3 is linked to the oscillator/detector only during the sensitivity phase A located at the start of each unblocking sequence 22 for this oscillator/detector, the receiver 26 cannot radiate or emit any electromagnetic energy via its antenna 3 outside of its sensitivity phase A, noting that the electromagnetic radiation produced during this sensitivity phase A is very weak and hence not troublesome since the amplitude of the oscillations of the oscillator/detector 2 during this sensitivity phase A is small.

It follows that the receiver 26 cannot deliver any energy to its antenna 3 and consequently produces no electromagnetic radiation via its antenna 3 which might be due to the phases of increased amplitude of the oscillations of the oscillator/detector 2 during the aforesaid phases B, C and D.

In an alternative, the low-frequency (LF) output 5 could be linked to the monostable 28 by way of a feedback circuit 28a making it possible to vary the duration of the first part A1 or the temporal position of this first part with respect to the sensitivity phase A of the oscillator/detector in the course of the period 21a so as to attenuate to a greater or lesser extent the signal at the nominal frequency delivered by the antenna to the oscillator/detector.

Figure 4:
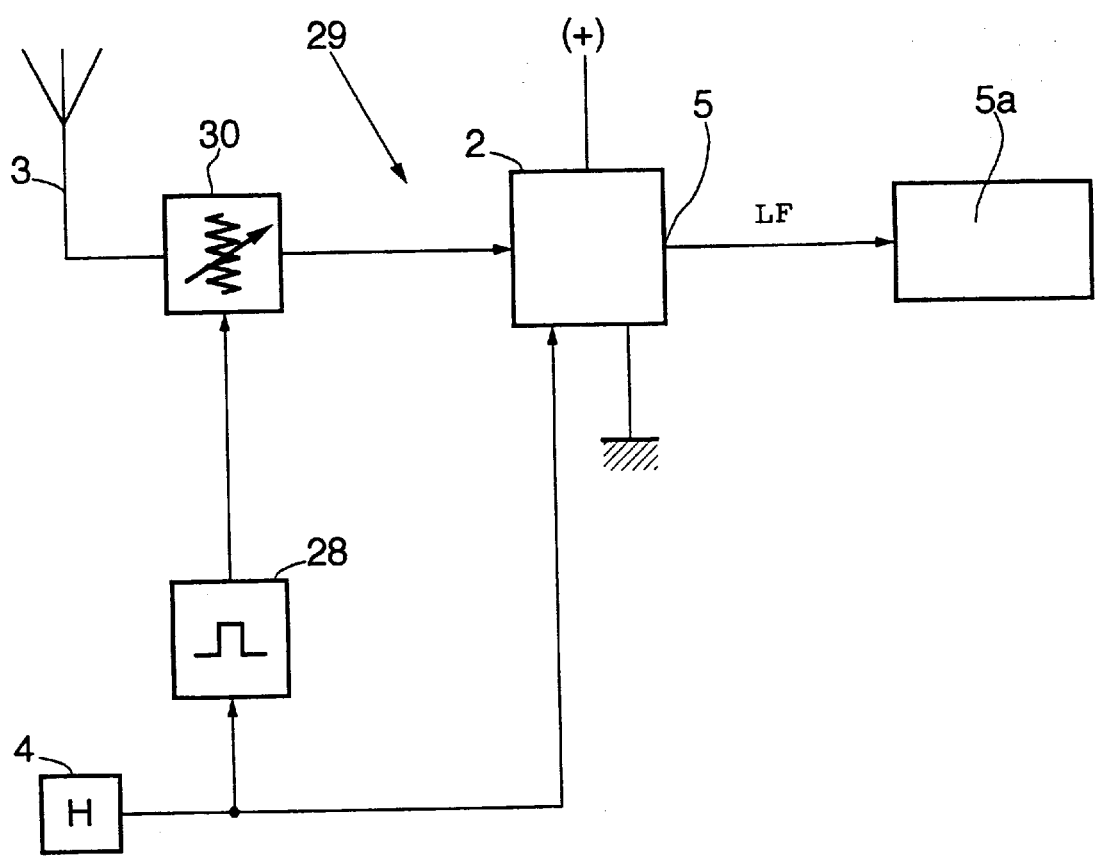
FIG. 4 represents a second embodiment of a receiver.

In the receiver 29 represented in FIG. 4, the switch 27 of the receiver 26 described with reference to FIG. 3 is replaced by a controlled attenuating circuit 30 which, under the pulse of the monostable 28 during the aforesaid sensitivity phase A, couples the oscillator/detector 2 and the antenna 3. By contrast, outside of this phase A, this attenuating circuit 30 decouples the oscillator/detector 2 and the antenna 3 while attenuating, for example by engendering losses, the amplitude of the signal passing through it within proportions which may be sizable.

Thus, the amplitude of the signal which the oscillator/detector 2 sends to the attenuating circuit 30 outside of this phase A undergoes a large reduction before reaching the antenna 3, so that the resulting electromagnetic radiation is weak.

In a simple embodiment, the attenuating circuit 30 could consist of a diode or a combination of PIN diodes whose impedance at radio frequencies varies as a function of the bias current.

Figure 5:
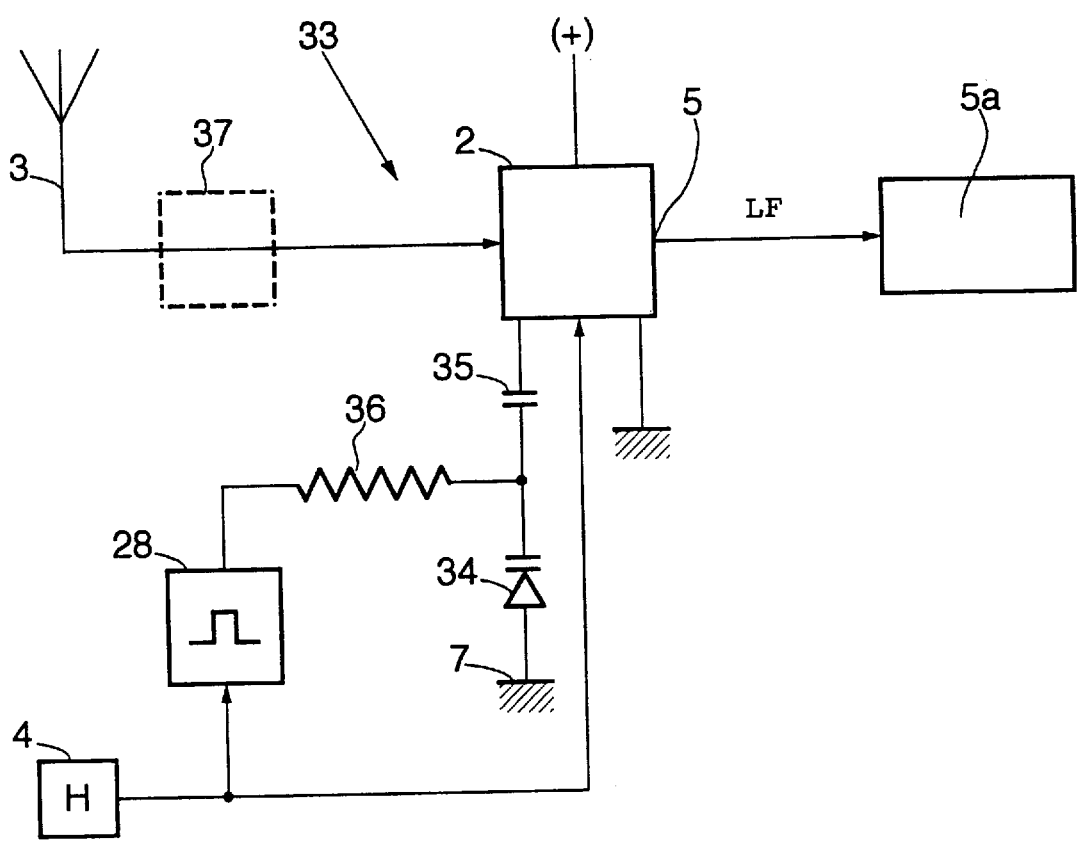
FIG. 5 represents a third embodiment of a receiver.

Referring now to FIG. 5, it may be seen that this represents a receiver 33 constituting another way of carrying out the coupling/uncoupling, on the nominal reception frequency, of the antenna 3 and the oscillator/detector 2 of the receivers described with reference to FIGS. 3 and 4.

This receiver 33 is able to operate the oscillator/detector 2 at its nominal reception frequency f1 during the aforesaid sensitivity phase A and to make it oscillate at a different frequency f2 outside of this sensitivity phase A, during the aforesaid phases B, C and D.

To do this, a variable-capacitance diode 34 and a capacitance 35 are mounted in series between the ground 7 and the collector of the transistor 6 of the oscillator/detector 2 and the output of the monostable 28 is connected to the link between this diode 34 and this capacitance 35 via a resistance 36. Any other means could be used to modify this frequency of oscillations, for example by modifying the polarity of the oscillator/detector 2.

It follows that, in this example of FIG. 5, the electromagnetic energy transmitted by the antenna 3 and generated by the oscillator/detector 2 during the aforesaid phases B, C and D is produced on a different frequency f2 from the nominal reception frequency f1 of this oscillator/detector 2. Consequently, the radio channel associated with the frequency f1 is not disturbed by the electromagnetic energy transmitted by the antenna 3 during the phases of increased-amplitude oscillations of the oscillator/detector 2.

In an alternative embodiment represented with dashes in FIG. 5, a fixed-frequency filter 37 tuned to the nominal reception frequency f1 can be mounted between the antenna 3 and the oscillator/detector 2 so as to attenuate the electromagnetic radiation or the radio energy transmitted by the antenna 3 on the modified frequency f2.

In another alternative, the filter 37 could be a fixed filter with smaller passband width than that of the oscillator/detector 2, tuned to the nominal frequency f1 of reception of this oscillator/detector, and preferably a, for example quartz, filter exhibiting a very narrow passband width, it being understood that such a filter, with high Q factor, is able to store energy so as to release it later.

In this layout, however, through the combination of the modifying of the operating frequency of the oscillator/detector 2, going from the frequency f1 to the frequency f2, and of the very narrow passband width of this quartz filter 37, tuned to the frequency f1, this quartz filter 37 is unable to store energy during the phases of increased-amplitude oscillation of the oscillator/detector 2 and therefore releases no energy during the subsequent sensitivity phase A2 of the oscillator/detector 2.

Figure 6:
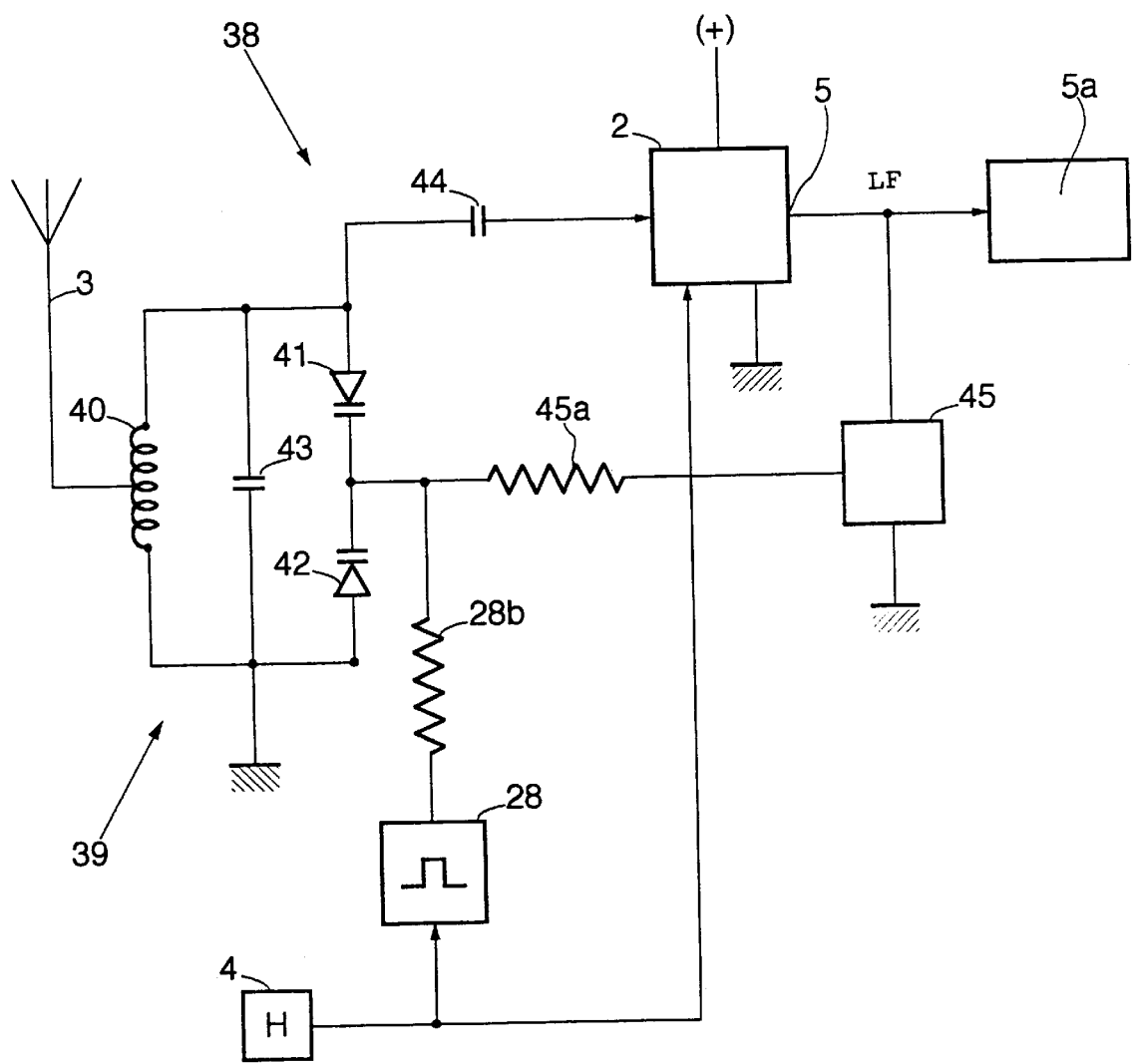
FIG. 6 represents a fourth embodiment of a receiver.

In the alternative of FIG. 6, the receiver 38 represented, which corresponds to a different embodiment of the receiver 33 described with reference to FIG. 5, comprises, with a view to the coupling/uncoupling of the antenna 3 and of the oscillator/detector 2, a tunable filter circuit 39 controlled by the monostable 28 and placed between the antenna 3 and the oscillator/detector 2, this circuit 39 being tuned to the nominal reception frequency f1 during the aforesaid first part A1 and to another frequency f2 outside of this first part A1 during the aforesaid phases B, C and D.

To do this, the circuit 39 comprises, in parallel, on the one hand, a self-inductance 40, two variable-capacitance diodes 41 and 42 in opposition and in series, and a tuning capacitance 43. The self-inductance 40 is linked to the antenna 3 by an intermediate branch, the point of linkage between the diodes 41 and 42 is linked to the monostable 28 via a resistance 28b and one of the ends of this circuit is grounded and the other linked to the input of the oscillator/detector 2 via a capacitance 44.

Furthermore, the low-frequency (LF) output 5 of the oscillator/detector 2 is linked to the input of a feedback stage 45 whose output is linked to the point of linkage between the diodes 41 and 42 via a resistance 45a. This feedback stage 45 outputs a voltage proportional to the peak voltage, detected and filtered, of the low-frequency (LF) signal, thus effecting the automatic gain control (AGC) function by putting the tuned filter 39 out of tune to a greater or lesser extent frequency-wise with respect to the nominal frequency f1 and during the first part A1 of the period 21a.

Thus, the circuit 39 is tuned to the nominal reception frequency f1 under the pulse of the monostable 28 associated with the first part A1 so as to exhibit the minimum of loss or attenuation on this nominal frequency and is tuned to another frequency f2 outside of this first part A1 so as to exhibit the maximum of loss or attenuation on said nominal frequency during this second part, at least partially suppressing all electromagnetic radiation by the antenna 3 during the aforesaid phases B, C and D as a consequence.

The circuit 39 thus carries out the functions of impedance matching between the antenna 3 and the oscillator/detector 2, of radiofrequency antenna filter, of automatic gain control (AGC) and of suppression of the unwanted radio radiations of the oscillator/detector 2.

In an alternative of FIG. 6, the antenna 3 and the self-inductance 40 could consist in particular of a tuned frame produced on a printed circuit, this frame thus constituting at one and the same time an antenna, a filter, and fulfilling the function of automatic gain control (AGC) and possibly of impedance matching.

Figure 7:
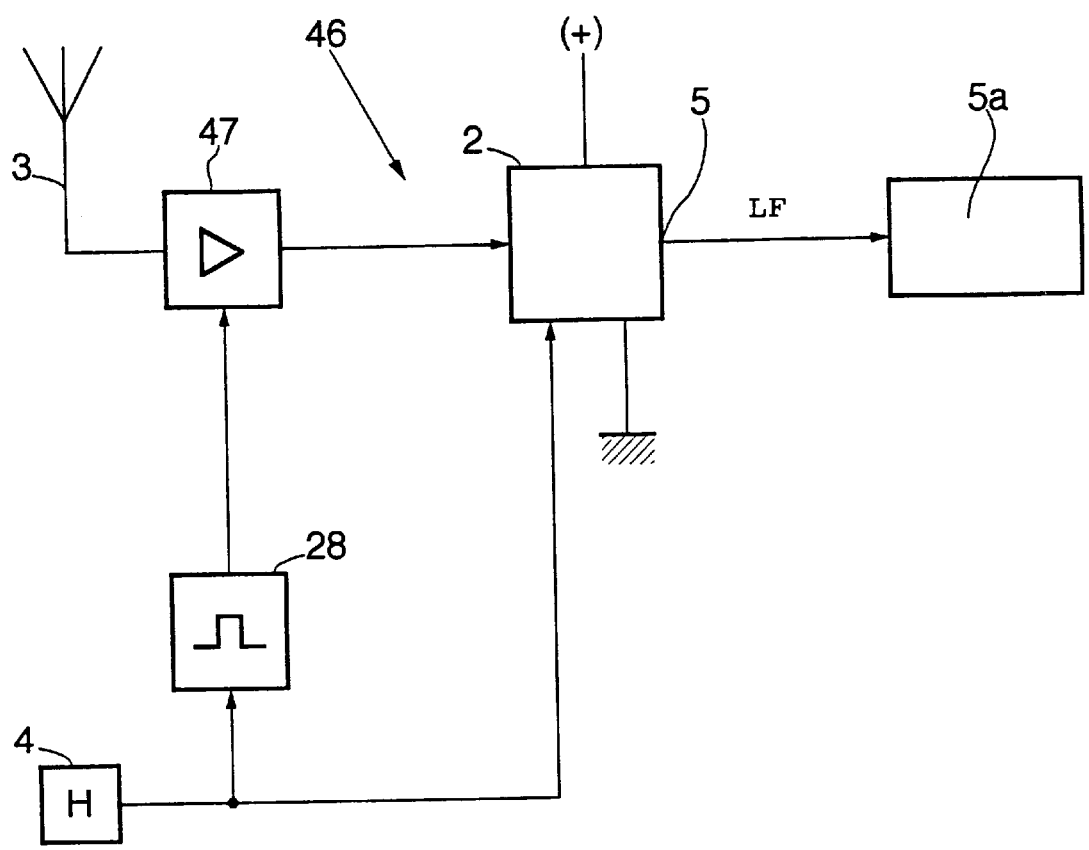
FIG. 7 represents a fifth embodiment of a receiver.

Referring now to FIG. 7, it may be seen that this represents a receiver 46 constituting another way of effecting the coupling/uncoupling, on the nominal reception frequency, of the antenna 3 and of the oscillator/detector 2. In this example, the antenna 3 is connected to the oscillator/detector 2 by way of an amplifying circuit 47.

This amplifying circuit, under the pulse of the monostable 28, and associated duration-wise with the aforesaid first part A1, amplifies the signal picked up by the antenna and delivers this amplified signal to the oscillator/detector 2, whereas outside of this first part A1, it is disconnected, that is to say that no signal received by the antenna 3 is forwarded to the oscillator/detector 2.

This alternative of FIG. 7 makes it possible to obtain a receiver which is very sensitive to small-amplitude electromagnetic signals, which does not radiate and which, moreover, consumes little electrical energy.

In a simple embodiment, the amplifier 47 could consist of a stage with one or more radiofrequency amplification integrated circuits or transistors.

The present invention is not limited to the examples described above. Many alternatives for producing a reduced-radiation super-regenerative receiver, especially by combining the examples described earlier, are possible without departing from the framework defined by the appended claims. In particular, the super-regenerative receiver could be of the type with built-in sampling or sequencing clock (self-quench).

I claim:

1. A receiver of radio signals, comprising:
   an antenna;
   a super-regenerative oscillator/detector;
   means for fixing periods composed of blocking/unblocking sequences of said oscillator/detector so as to render said oscillator/detector sensitive to energy received on a nominal reception frequency;
   wherein said oscillator/detector exhibits, in each of said periods, a phase of sensitivity followed by a phase of amplitude rise or increased amplitude and then of decay of oscillations of said oscillator/detector;
   means for fixing in each period a first part and a second part, coupled to said means for fixing periods, wherein said second part follows said first part, wherein the first part corresponds substantially to the phase of sensitivity of said oscillator/detector, and wherein the second part corresponds substantially to the phase of amplitude rise or increased amplitude and of decay of the oscillations of said oscillator/detector; and
   coupling/uncoupling means linked to the antenna, to said oscillator/detector, and to said means for fixing periods, wherein said coupling/uncoupling means at least partially couple the antenna to the oscillator/detector on the nominal reception frequency during said first part of each of said periods, and wherein said coupling/uncoupling means at least partially uncouple the antenna from the oscillator/detector on the nominal reception frequency during at least said second part of each of said periods, so that the electromagnetic energy apt to be emitted by the receiver on said nominal reception frequency at least during said second part of each of said periods is attenuated or suppressed.

2. The receiver as claimed in claim 1, wherein said coupling/uncoupling means comprise:
   switching and/or attenuating and/or amplifying and/or filtering means connected between said antenna and said oscillator/detector; and
   means for control of said switching and/or attenuating and/or amplifying and/or filtering means so as, during each of said periods, to connect said antenna to said oscillator/detector during said first part of said periods and so as at least partially to disconnect said antenna from said oscillator/detector at least during said second part of said periods.

3. The receiver as claimed in claim 2, wherein the coupling/uncoupling means comprise means for causing the oscillator/detector to oscillate at an auxiliary frequency different from the nominal reception frequency during the second part of the periods.

4. The receiver as claimed in claim 3, wherein the coupling/uncoupling means comprise a fixed filter with a passband narrower than a frequency range of the oscillator/detector, wherein the fixed filter is tuned to the nominal reception frequency of the oscillator/detector, and wherein the oscillator/detector is coupled to the antenna through the fixed filter.

5. The receiver as claimed in claim 2, wherein the coupling/uncoupling means comprise a frequency-selective antenna wherein during the first part of the periods the frequency-selective antenna is tuned to the nominal reception frequency, and wherein during the second part of the periods the filter is tuned to an auxiliary frequency different from the nominal reception frequency.

6. The receiver as claimed in claim 2, wherein the coupling/uncoupling means comprise, in respect of the signal at the nominal reception frequency and by virtue of a feedback circuit, a circuit attenuating the level of the signal received at the nominal reception frequency reaching the oscillator/detector, which can be controlled or is variable in amplitude, in frequency or temporally as a function of the amplitude of the low-frequency output signal, partially passing during the first part of the periods, thus constituting an automatic gain control.

7. The receiver as claimed in claim 2, wherein the means for fixing in each of the periods the first part and the second part comprise a monostable whose two states respectively determine the first and second parts of each of the periods.

8. The receiver as claimed in claim 1, wherein said coupling/uncoupling means comprise:
   an electronic switch mounted between said antenna and said oscillator/detector;
   means for closing said switch solely during said first part of said periods; and
   means for disconnecting said antenna or for connecting said antenna to ground at least during said second part of said periods.

9. The receiver as claimed in claim 1, wherein said coupling/uncoupling means comprise:
   attenuating means mounted between said antenna and said oscillator/detector; and
   means for control of said attenuating means so as, during each of said periods, to connect said antenna to said oscillator/detector during said first part of said periods and to reduce the amplitude of the signals radiated by the antenna at least during the second part of said periods.

10. The receiver as claimed in claim 1, wherein said coupling/uncoupling means comprise a filter mounted between said antenna and said oscillator/detector, said filter being tuned for substantially minimum loss or attenuation on said nominal reception frequency during said first part of said periods and comprising means so as to be tuned to an auxiliary frequency different from said nominal reception frequency during said second part of said periods and to exhibit the maximum of loss or attenuation on said nominal reception frequency during said second part.

11. The receiver as claimed in claim 10, wherein said coupling/uncoupling means comprise a tunable filter circuit comprising in parallel a self-inductance, two variable-capacitance diodes in opposition and in series, and a capacitance, the self-inductance being linked to the antenna, the point of linkage between said diodes being linked to the means fixing said first and second parts, one of the ends of said tunable filter circuit being linked to ground and the other end of said tunable filter circuit being linked to the input of the oscillator/detector.

12. The receiver as claimed in claim 10, wherein the coupling/uncoupling means comprise means for causing the oscillator/detector to oscillate at an auxiliary frequency different from the nominal reception frequency during the second part of the periods.

13. The receiver as claimed in claim 12, wherein the coupling/uncoupling means comprise a fixed filter with a passband narrower than a frequency range of the oscillator/detector, wherein the fixed filter is tuned to the nominal reception frequency of the oscillator/detector, and wherein the oscillator/detector is coupled to the antenna through the fixed filter.

14. The receiver as claimed in claim 1, wherein said coupling/uncoupling means comprise:
   amplifying means connected between the antenna and the oscillator/detector; and
   means of control so as, during solely the first part of said sequences, to cause said amplifying means to amplify the signal picked up by the antenna and to deliver the amplified signal to the oscillator/detector and so as, during the second part of said periods, to disconnect said amplifying means.

15. The receiver as claimed in claim 1, wherein said coupling/uncoupling means comprise means for causing said oscillator/detector to oscillate at an auxiliary frequency different from said nominal reception frequency during said second part of said periods.

16. The receiver as claimed in claim 15, wherein said coupling/uncoupling means comprise a fixed filter with a passband narrower than a frequency range of said oscillator/detector, wherein said fixed filter is tuned to the nominal reception frequency of said oscillator/detector, and wherein said oscillator/detector is coupled to said antenna through said fixed filter.

17. The receiver as claimed in claim 16, wherein the fixed filter is a quartz filter.

18. The receiver as claimed in claim 15, wherein the coupling/uncoupling means comprise a frequency-selective antenna wherein during the first part of the periods the frequency-selective antenna is tuned to the nominal reception frequency, and wherein during the second part of the periods the filter is tuned to an auxiliary frequency different from the nominal reception frequency.

19. The receiver as claimed in claim 15, wherein the coupling/uncoupling means comprise, in respect of the signal at the nominal reception frequency and by virtue of a feedback circuit, a circuit attenuating the level of the signal received at the nominal reception frequency reaching the oscillator/detector, which can be controlled or is variable in amplitude, in frequency or temporally as a function of the amplitude of the low-frequency output signal, partially passing during the first part of the periods, thus constituting an automatic gain control.

20. The receiver as claimed in claim 15, wherein the means for fixing in each of the periods the first part and the second part comprise a monostable whose two states respectively determine the first and second parts of each of the periods.

21. The receiver as claimed in claim 1, wherein said coupling/uncoupling means comprise a frequency-selective antenna wherein during said first part of said periods said frequency-selective antenna is tuned to said nominal reception frequency, and wherein during said second part of said periods said filter is tuned to an auxiliary frequency different from said nominal reception frequency.

22. The receiver as claimed in claim 21, wherein the coupling/uncoupling means comprise, in respect of the signal at the nominal reception frequency and by virtue of a feedback circuit, a circuit attenuating the level of the signal received at the nominal reception frequency reaching the oscillator/detector, which can be controlled or is variable in amplitude, in frequency or temporally as a function of the amplitude of the low-frequency output signal, partially passing during the first part of the periods, thus constituting an automatic gain control.

23. The receiver as claimed in claim 21, wherein the means for fixing in each of the periods the first part and the second part comprise a monostable whose two states respectively determine the first and second parts of each of the periods.

24. The receiver as claimed in claim 1, wherein said coupling/uncoupling means comprise, in respect of the signal at the nominal reception frequency and by virtue of a feedback circuit, a circuit attenuating the level of the signal received at the nominal reception frequency reaching the oscillator/detector, which can be controlled or is variable in amplitude, in frequency or temporally as a function of the amplitude of the low-frequency output signal, partially passing during said first part of said periods, thus constituting an automatic gain control.

25. The receiver as claimed in claim 24, wherein the means for fixing in each of the periods the first part and the second part comprise a monostable whose two states respectively determine the first and second parts of each of the periods.

26. The receiver as claimed in claim 1, wherein said means for fixing in each of said periods said first part and said second part comprise a monostable whose two states respectively determine the first and second parts of each of said periods.

27. The receiver as claimed in claim 1, wherein the means for fixing periods is a clock.

28. The receiver as claimed in claim 1, wherein the means for fixing in each period the first part and the second part is a timing circuit.

29. The receiver as claimed in claim 1, wherein the coupling/uncoupling means comprise a filter that couples the antenna to the oscillator/detector, wherein during the first part of the periods the filter is tuned for substantially minimum attenuation at the nominal reception frequency, and wherein during the second part of the periods the filter is tuned for substantially maximum attenuation at the nominal reception frequency.

30. A radio receiver, comprising:
   an antenna;
   a regenerative oscillator;
   a clock that indicates a sequence of periods, wherein each period comprises a blocking sequence and an unblocking sequence;
   wherein the oscillator is coupled to the clock and configured so that oscillations in the oscillator are blocked during blocking sequences and so that oscillations in the oscillator are unblocked during unblocking sequences;
   wherein the oscillator exhibits, in each of the periods, a phase of sensitivity and a phase of feedback;
   a timing circuit coupled to the clock, wherein in each of the periods the timing circuit indicates a first part and a second part, wherein the timing circuit is configured so that the first part of each of the periods corresponds substantially to the phase of sensitivity of the oscillator, and wherein the second part of each of the periods corresponds substantially to the phase of feedback of the oscillator; and a controllable coupler coupled to the antenna, to the oscillator, and to the timing circuit, wherein the controllable coupler couples the antenna to the oscillator on a reception frequency during the first part of each of the periods, and wherein the controllable coupler at least partially uncouples the antenna from the oscillator on the reception frequency during at least the second part of each of the periods.

31. The radio receiver of claim 30, wherein the controllable coupler comprises:

a switch coupled to the antenna, to the oscillator, and to the timing circuit, and wherein the switch is configured to disconnect the antenna from the oscillator during the second part of each of the periods.

32. The radio receiver of claim 30, wherein the controllable coupler comprises:

an amplifier coupled to the antenna, to the oscillator, and to the timing circuit, wherein the amplifier is configured to provide a received signal on the reception frequency from the antenna to the oscillator during the first part of each of the periods, and wherein the amplifier is configured to disconnect the antenna on the reception frequency from the oscillator during the second part of each of the periods.

33. The radio receiver of claim 30, wherein the controllable coupler comprises:

a filter coupled to the antenna, the oscillator, and the timing circuit, wherein the antenna is coupled to the oscillator through the filter, wherein the filter is configured to couple the antenna to the oscillator with a relatively small attenuation on the reception frequency during the first part of each of the periods, and wherein the filter is configured to couple the antenna to the oscillator with a relatively large attenuation on the reception frequency during the second part of each of the periods.

34. The radio receiver of claim 30, wherein the controllable coupler comprises:

a tunable filter coupled to the antenna, the oscillator, and the timing circuit, wherein the antenna is coupled to the oscillator through the tunable filter, wherein the tunable filter is configured to couple the antenna to the oscillator on the reception frequency during the first part of each of the periods, and wherein the tunable filter is configured to tune to a different auxiliary frequency during the second part of each of the periods, thereby uncoupling the antenna from the oscillator on the reception frequency during the second part of each of the periods.

35. The radio receiver of claim 30, wherein the controllable coupler comprises:

means for causing the oscillator to oscillate at an auxiliary frequency different from the reception frequency during the second part of the periods.

36. The radio receiver of claim 30, wherein the controllable coupler comprises:

means for causing the oscillator to oscillate at an auxiliary frequency different from the reception frequency during the second part of the periods; and a fixed filter with a passband narrower than a frequency range of the oscillator, wherein the oscillator is coupled to the antenna through the fixed filter, and wherein the fixed filter is tuned to the reception frequency.

37. The radio receiver of claim 30, wherein the antenna is a tunable frequency-selective antenna, and wherein the controllable coupler comprises:

means for adjusting the tunable frequency-selective antenna so that the tunable frequency-selective antenna is tuned to the reception frequency during the first part of each of the periods, and so that the tunable frequency-selective antenna is tuned to a different auxiliary frequency during the second part of each of the periods.

38. The radio receiver of claim 30, wherein the phase of feedback is characterized by one or more of: a rise in amplitude of oscillations in the oscillator, increased amplitude of oscillations in the oscillator, and decay of oscillations in the oscillator.

39. In a radio receiver, a method for reducing re-emissions through a receiving antenna from a regenerative oscillator, the method comprising:

during a first part of each quench period of the oscillator, coupling the antenna to the oscillator, wherein the first part of each quench period is characterized by sensitivity of the oscillator to signals received by the antenna;

during a second part of each quench period of the oscillator, uncoupling the antenna from the oscillator, wherein the second part of each quench period is characterized by decay of oscillations in the oscillator and by one or more of: (i) a rise in amplitude of oscillations in the oscillator and (ii) increased amplitude of oscillations in the oscillator.

40. The method of claim 39, wherein the first part of each quench period of the oscillator occurs during a sequence wherein the oscillator is unblocked from oscillating.

41. The method of claim 39, wherein the second part of each quench period of the oscillator includes a sequence wherein the oscillator is blocked from oscillating.

42. The method of claim 39, wherein the antenna and the oscillator are coupled by a controllable coupler, wherein the controllable coupler is configured to couple the antenna to the oscillator during the first part of each quench period of the oscillator, and wherein the controllable coupler is configured to uncouple the antenna from the oscillator during the second part of each quench period of the oscillator.

43. The method of claim 39, wherein the antenna and the oscillator are coupled by a switch, wherein the switch is configured to couple the antenna to the oscillator during the first part of each quench period of the oscillator, and wherein the switch is configured to uncouple the antenna from the oscillator during the second part of each quench period of the oscillator.

44. The method of claim 39, wherein the antenna and the oscillator are coupled by an amplifier, wherein the amplifier is configured to couple the antenna to the oscillator during the first part of each quench period of the oscillator, and wherein the amplifier is configured to uncouple the antenna from the oscillator during the second part of each quench period of the oscillator.

45. The method of claim 39, wherein the antenna and the oscillator are coupled by a filter, wherein the filter is configured to couple the antenna to the oscillator during the first part of each quench period of the oscillator, and wherein the filter is configured to uncouple the antenna from the oscillator during the second part of each quench period of the oscillator.

46. The method of claim 39, wherein the antenna and the oscillator are coupled by a tunable filter, wherein the tunable filter is configured to couple the antenna to the oscillator at a receive frequency for the radio receiver during the first part of each quench period of the oscillator, and wherein the tunable filter is configured to tune to an auxiliary frequency different from the receive frequency during the second part of each quench period of the oscillator.

47. The method of claim 39, wherein the oscillator is a tunable oscillator, wherein said coupling the oscillator to the antenna comprises tuning the oscillator to a receive frequency for the radio receiver, and wherein said uncoupling the oscillator from the antenna comprises tuning the oscillator to an auxiliary frequency different from the receive frequency.

48. The method of claim 47, wherein the antenna and the oscillator are coupled by a fixed passband filter tuned to the receive frequency.

49. The method of claim 39, wherein the antenna is a tunable antenna, wherein said coupling the oscillator to the antenna comprises tuning the antenna to a receive frequency for the radio receiver, and wherein said uncoupling the oscillator from the antenna comprises tuning the antenna to an auxiliary frequency different from the receive frequency.

50. The method of claim 49, wherein the antenna and the oscillator are coupled by a fixed passband filter tuned to the receive frequency.

* * * * *